United States Patent [19]

Romine

[11] 3,951,494

[45] Apr. 20, 1976

[54] ELECTRICAL CONNECTOR

[75] Inventor: Edward L. Romine, Darien, Ill.

[73] Assignee: Molex Incorporated, Lisle, Ill.

[22] Filed: Nov. 14, 1974

[21] Appl. No.: 523,584

[52] U.S. Cl. ........................ 339/17 L; 339/176 MP; 339/217 R

[51] Int. Cl.[2] ........................ H05K 1/02

[58] Field of Search .............. 339/17 R, 17 C, 17 L, 339/17 LC, 17 LM, 17 M, 176 MF, 176 MP, 217 R, 217 S

[56] References Cited

UNITED STATES PATENTS

| | | | |
|---|---|---|---|
| 3,582,863 | 6/1971 | Hoffman | 339/17 R |
| 3,646,504 | 2/1972 | Classon | 339/176 MP |
| 3,697,926 | 10/1972 | Krafthefer | 339/217 R |

*Primary Examiner*—Roy Lake
*Assistant Examiner*—Mark S. Bicks
*Attorney, Agent, or Firm*—Louis A. Hecht

[57] ABSTRACT

An electrical connector mountable on top of a printed circuit board and connectable to a conductive element located below the connector. The connector generally includes an insulated housing having a plurality of terminal receiving cavities therein and a plurality of like terminals mounted in said cavities. Each terminal receiving cavity has a top opening and a bottom opening through which the conductive element is received in the cavity. The housing also includes a side wall with terminal tail positioning means for positioning and holding a tail portion of a terminal. Each terminal generally includes an elongated strip of metal formed to have a preloaded biased portion adapted to be received in the cavity to engage the conductive element and a tail portion extending from the base portion out of the cavity through the top opening and bent over and down along the side wall so that the end points downwardly for connection to the printed circuit board. The tail portion cooperates with the terminal tail positioning means so that the tail portion is properly positioned and held.

6 Claims, 4 Drawing Figures

ELECTRICAL CONNECTOR

BACKGROUND OF THE INVENTION

1. Field of the Invention

The present invention relates generally to electrical connectors.

2. Brief Description of the Prior Art

Electrical connectors for use with a printed circuit board are common and come in a number of different general forms. Each form is adapted to receive one or more conductive elements as, for example, from a pin connector.

Electrical connectors of this type are mountable on top of a printed circuit board and usually include an insulated housing having one or more terminal receiving cavities formed therein and a terminal mounted in each of the cavities to engage each of the conductive elements. The different general forms in which a connector of this type is classified depends on from what direction the conductive element or elements are received in the cavities. The type of connector where the conductive element or elements are received into the housing through the top or side thereof do not offer as many problems as a bottom entry connector wherein the conductive element or elements are received through the bottom of the housing.

Two general alternatives are available to effect bottom entry electrical connection. First, each terminal can have a printed circuit type tail which extends downwardly from the main body of the terminal to a connection on the printed circuit board. In order to do this, the tail must be struck from a base portion or body portion of the terminal. The other alternative is to have the tail portion of the terminal extend through the top of the housing and then in some manner bend it back downwardly so that it connects with a portion of the printed circuit board.

One way of accomplishing the first alternative is disclosed in U.S. Pat. No. 3,697,926. This method is satisfactory where the width of the terminal stock is such that it allows the tail portion to be struck from the base portion. However, where the terminal is small and does not have a sufficient width, this alternative becomes impractical.

Problems also arise with the second alternative in that, especially if the terminal is small, the tail portion is too unstable. Thus, it becomes difficult to position the tail portions preparatory to soldering on a printed circuit board and, once the tail portion is soldered to the printed circuit board, the solder joint would tend to crack due to the instability.

SUMMARY OF THE INVENTION

It is therefore the principal object of the present invention to provide a bottom entry electrical connector of the type described that is mountable on the top of a printed circuit board and connectable to a conductive element located below the connector which solves the problems described.

This and other objects of the invention are accomplished by one form of an electrical connector currently contemplated. This connector includes an insulated housing having at least one terminal receiving cavity and a terminal mounted in the cavity. The terminal receiving cavity has a top opening and a bottom opening through which the conductive element is received in the cavity. The housing also includes a side wall with terminal tail positioning means for positioning and holding a tail portion of a terminal. Each terminal includes an elongated strip of metal formed to have a preloaded biased portion adapted to be received in said cavity to engage said conductive element and a tail portion extending out of the cavity through the top opening and bent over and down along the side wall so that the end points downwardly for connection to the printed circuit board. The tail portion cooperates with the terminal tail positioning means so that the tail portion is properly positioned and held.

DESCRIPTION OF THE PREFERRED EMBODIMENT

Figure 1:
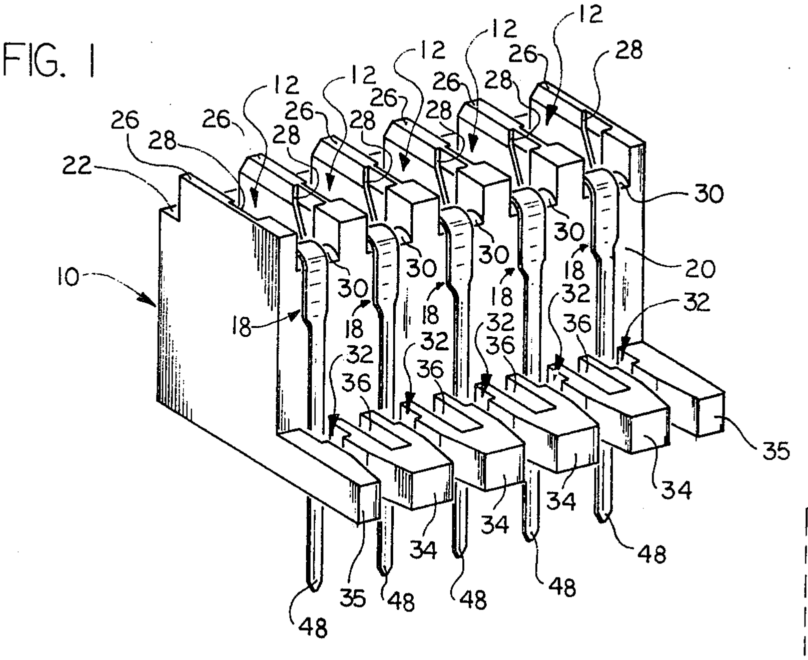
FIG. 1 is a perspective view of the electrical connector of the present invention.

Turning now to FIG. 1 in greater detail, the electrical connector of the present invention is seen to generally include an insulated housing, generally designated 10, having a plurality of terminal receiving cavities, generally designated 12, with each having a top opening 14 and a bottom opening 16. A terminal, generally designated 18, is received within each of the terminal receiving cavities 12 in a manner which will be discussed in greater detail hereinafter.

The housing 10 is seen to generally include two side walls 20 (FIGS. 1–3) and 22 (FIGS. 2 and 3) a bottom wall 24 (FIGS. 2 and 3) and vertical separating walls 26 for separating the cavities 12 from one another. Each of these separating walls 26 has a guide recess 28 formed on either side thereof. Notches 30 are formed on side wall 20 between each of the separating walls 26 to aid in positioning each terminal 18 in a manner to be described in greater detail hereinafter. Each cavity 12 has its respective notch 30.

Figure 3:
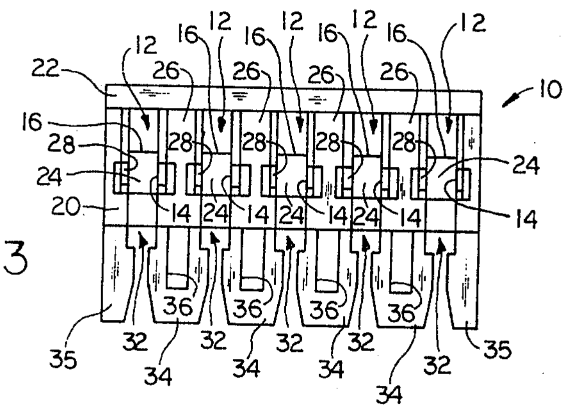
FIG. 3 is a top plan view of an insulated housing comprising a part of the electrical connector of the present invention.

Side wall 20 has a pluraity of slotted openings 31 each communicating with a cavity 12 and a plurality of terminal tail receiving areas, generally designated 32, one for each cavity 12, formed near the bottom of the side wall. A portion of each terminal 18 is adapted to be received in area 32 to position and hold each terminal. More particularly, the receiving areas 32 are formed between a plurality of spaced apart tapered tabs 34 which extend laterally outwardly from the bottom of side wall 20 as is best shown in FIGS. 1 and 3. Two thinner tabs 35 are formed on either side of the row of tabs 34. Each tab 34 has a cut out area 36 generally in the center thereof. The cut out 36 makes tabs 34 more resilient.

Figure 4:
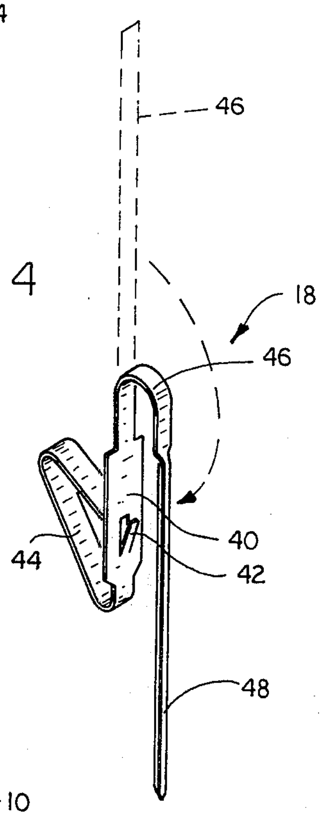
FIG. 4 is an enlarged perspective view of a terminal employed in the electrical connector of the present invention.

Turning now to FIG. 4 in greater detail, the terminal 18 which is used in conjunction with housing 10 to form the connector of the present invention, is fabricated of a single piece of sheet brass or other suitable metal which is formed to the shape shown and spring tempered to provide a resilient body. Initially, the single piece is in a straight line and has portions with four different widths. The base portion 40 has the largest width and has a tang 42 struck therefrom. A loop-shaped portion 44 is formed from one end of the base portion 40 while an intermediate portion 46 is formed between the base portion 40 and a tail portion 48.

The terminal 18 is in the configuration shown in FIG. 4 in phantom prior to its insertion into its respective terminal receiving cavity 12. That is, the loop-shaped portion 44 is formed but the intermediate portion 46 and tail portion extend in a straight line from the base portion 40. The terminal 18 is then inserted into its respective cavity through the top opening 14 thereof. The guide recesses 28 serve to aid its entry and position the terminal 18 within the cavity.

When the terminal 18 is fully inserted into its cavity 12, each slotted side opening 31 receives the tang 42 of each terminal 18 which serves to locate the terminal in a predetermined position within the cavity 12. In addition, accidental retraction of the terminal through the top opening 14 is prevented by virtue of the tang 42 engaging the slotted side opening 31.

After the terminals 18 have been inserted in their respective cavities 12 as described, a suitable tool is used to bend portion 46 so that it follows the contour of notch 30. When thus bent, the tail portion 48 is received between tabs 34 (and 35) so that they will snap-fit within their respective tail receiving area 32. The spaces between tabs 34 are somewhat less than the width of tail portion 48. But, because of the cut out 36 in each of tabs 34, each tab 34 is able to flex inwardly to accomodate this width so that each tail portion 48 may be received in its respective terminal tail receiving area 32.

Because portion 46 is positioned in its respective notch 30 and the tail portion 48 is positioned and held in its respective tail receiving area 32, a terminal 18 having a relatively narrow width can be held and positioned in a very stable fashion.

Figure 2:
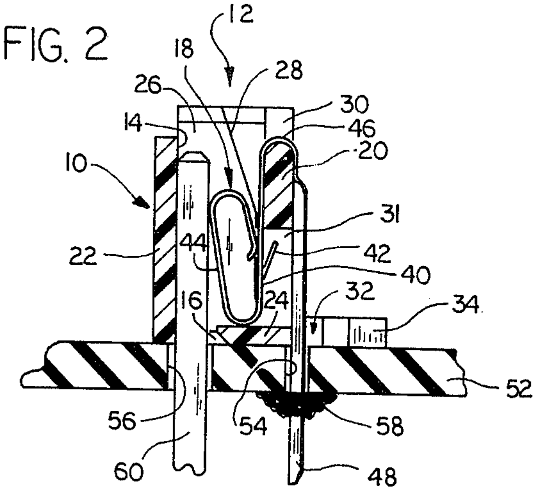
FIG. 2 is a side sectional view of the electrical connector of the present invention mounted on a printed circuit board and showing a terminal receiving cavity which has a conductive element received therein.

In use, the connector of the present invention is mounted on top of a printed circuit board 52 as best shown in FIG. 2. The board 52 has a plurality of holes 54 and a plurality of holes 56 formed therein. Each hole 54 is adapted to receive the bottom end of the tail portion 48 of each terminal 18 therethrough while each hole 56 is adapted to align with each of the bottom openings 16 of the terminal receiving cavities 12.

The tail portion 48 is held and electrically connected to the circuit on the board 52 by means of solder 58. A plurality of conductive elements 60 such as pins, are receivable through holes 56 up into their respective cavities 12.

When a pin or pins 60 are plugged into the respective cavities 12, the loop-shaped portions 44 flatten out to some extent as shown in FIG. 2. Each pin 60 is confined between the loop-shaped portion 44 and the interior of side wall 22 by reason of the spring pressure exerted by the terminal 18. This forms a mechanical and electrical connection between the individual pin 60 and the respective terminals 18.

I claim:

1. An electrical connector mountable on top of a printed circuit board and connectable to a conductive element located below said connector, said electrical connector comprising:

an insulated housing having at least one terminal receiving cavity having a top opening and a bottom opening through which the conductive element is received in the cavity, said housing including a side wall having a terminal tail receiving area defined between two spaced apart flexible tabs, said area having an area entrance space of smaller width than said area through which a terminal tail is receivable into said area; and a terminal mounted in said cavity, said terminal including an elongated strip of metal formed to have a pre-loaded biased portion adapted to be received in said cavity to engage said conductive element and a tail portion extending out of the cavity through the top opening and bent over and down along the side wall so that the end points downwardly for connection to the printed circuit board, said tail portion being received in said receiving area and having a width greater than said area entrance so that said tail portion is restrained from side to side movement or movement perpendicularly outwardly from the side wall when received in said area prior to mounting on said printed circuit board.

2. The connector of claim 1 wherein said terminal has a portion intermediate the biased portion and the tail portion, said housing including a notch near the top opening for positioning said intermediate portion.

3. The connector of claim 1 wherein said biased portion of the terminal is generally loop-shaped in configuration.

4. An electrical connector mountable on top of a printed circuit board and connectable to a plurality of conductive elements located below said connector, said electrical connector comprising:

an insulated housing having a plurality of terminal receiving cavities each having a top opening and a bottom opening through which a conductive element is received in the cavity, said housing including a side wall having a plurality of notches one for each cavity formed near the top opening thereof and a plurality of terminal tail receiving areas defined between pairs of spaced apart flexible tabs extending laterally from the side wall at the bottom thereof, each area having an area entrance space of smaller width than said area through which a terminal tail is receivable into said area; and a plurality of like terminals each mounted in a cavity, each terminal including an elongated strip of metal formed to have a preloaded biased portion adapted to be received in said cavity to engage said conductive element and intermediate portion extending from the biased portion out of the cavity through the top opening and bent over and down so that it is received in its respective notch, and a tail portion extending from said intermediate portion so that the end thereof points downwardly for connection to the printed circuit board, said tail portion being received in said receiving area and having a width greater than said area entrance so that said tail portion is restrained from side to side movement or movement perpendicularly outwardly from the side wall when received in said area prior to mounting on said printed circuit board.

5. The connector of claim 4 wherein some of the tabs include cut outs to provide lateral resiliency.

6. The connector of claim 4 wherein each biased portion of each terminal is generally loop-shaped in configuration.

* * * * *